US012587197B2

(12) United States Patent
Lee

(10) Patent No.: US 12,587,197 B2
(45) Date of Patent: Mar. 24, 2026

(54) MULTI-PHASE CLOCK GENERATOR CIRCUIT

(71) Applicant: Skyworks Solutions, Inc., Irvine, CA (US)

(72) Inventor: Calvin Yoji Lee, Corvallis, OR (US)

(73) Assignee: Skyworks Solutions, Inc., Irvine, CA (US)

( * ) Notice: Subject to any disclaimer, the term of this patent is extended or adjusted under 35 U.S.C. 154(b) by 295 days.

(21) Appl. No.: 18/518,121

(22) Filed: Nov. 22, 2023

(65) Prior Publication Data

US 2024/0171182 A1 May 23, 2024

Related U.S. Application Data

(60) Provisional application No. 63/427,746, filed on Nov. 23, 2022.

(51) Int. Cl.
*H03L 7/081* (2006.01)
*H03K 3/011* (2006.01)

(52) U.S. Cl.
CPC ............ *H03L 7/0814* (2013.01); *H03K 3/011* (2013.01); *H03L 7/0818* (2013.01)

(58) Field of Classification Search
CPC ...... H03L 7/0814; H03L 7/0818; H03K 3/011
See application file for complete search history.

(56) References Cited

U.S. PATENT DOCUMENTS

| | | | | |
|---|---|---|---|---|
| 5,414,741 | A | * | 5/1995 | Johnson ................. H03D 3/245 |
| | | | | 375/376 |
| 6,639,534 | B2 | | 10/2003 | Khoini-poorfard et al. |
| 6,909,390 | B2 | | 6/2005 | Khoini-poorfard et al. |
| 9,054,653 | B2 | | 6/2015 | Gorbachov |
| 9,391,625 | B1 | * | 7/2016 | Xu ........................ H03B 5/1243 |
| 10,826,738 | B2 | * | 11/2020 | Pan ....................... H03F 1/0277 |
| 11,025,259 | B2 | | 6/2021 | Jain et al. |
| 11,424,841 | B1 | * | 8/2022 | Mohindra .............. H04B 17/14 |
| 11,509,317 | B2 | | 11/2022 | Jain et al. |
| 11,874,312 | B1 | * | 1/2024 | Lagler ............. G01R 31/31709 |
| 2003/0151533 | A1 | | 8/2003 | Khoini-poorfard et al. |
| 2004/0119621 | A1 | | 6/2004 | Khoini-poorfard et al. |
| 2005/0001937 | A1 | * | 1/2005 | Lee ........................ H03D 7/165 |
| | | | | 348/731 |
| 2014/0197892 | A1 | | 7/2014 | Gorbachov |

(Continued)

FOREIGN PATENT DOCUMENTS

| | | | | | |
|---|---|---|---|---|---|
| CN | 114487598 | A | * | 5/2022 | ........... G01R 23/165 |
| CN | 116839758 | A | * | 10/2023 | ......... G01K 11/3206 |

(Continued)

*Primary Examiner* — Adam D Houston
(74) *Attorney, Agent, or Firm* — Knobbe, Martens, Olson & Bear, LLP

(57) ABSTRACT

A multi-phase clock generator circuit has a voltage controlled phase shifter adapted to generate an interpolated clock signal having an interpolated phase shift with respect to at least two reference clock signals received by the multi-phase clock generator circuit from reference clock sources. The generator circuit also includes a feedback circuit adapted to generate, in response to a detected phase difference between the interpolated clock signal and the reference clock signals, a control voltage applied to the voltage controlled phase shifter for tuning the voltage controlled phase shifter.

21 Claims, 10 Drawing Sheets

(56) References Cited

U.S. PATENT DOCUMENTS

| | | | | |
|---|---|---|---|---|
| 2015/0214966 A1* | 7/2015 | Tong | ..................... | H03L 7/0992 |
| | | | | 327/157 |
| 2020/0119742 A1 | 4/2020 | Jain et al. | | |
| 2021/0200257 A1* | 7/2021 | Huang | ...................... | G06F 1/08 |
| 2023/0142749 A1 | 5/2023 | Jain et al. | | |
| 2024/0171139 A1 | 5/2024 | Lehtola | | |
| 2024/0171182 A1* | 5/2024 | Lee | ....................... | H03L 7/0814 |
| 2024/0186961 A1 | 6/2024 | Leuenberger et al. | | |

FOREIGN PATENT DOCUMENTS

| | | | | | | |
|---|---|---|---|---|---|---|
| CN | 219935149 U | * | 10/2023 | | | |
| CN | 119856468 A | * | 4/2025 | | .............. | H03C 5/00 |
| JP | H08331079 A | * | 12/1996 | | | |
| JP | H1078462 A | * | 3/1998 | | | |
| JP | 2000091914 A | * | 3/2000 | | | |
| JP | 2007006060 A | * | 1/2007 | | | |
| JP | 2019168244 A | * | 10/2019 | | | |

* cited by examiner

MULTI-PHASE CLOCK GENERATOR CIRCUIT

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of the present invention relate to electronic systems, and in particular to radio frequency (RF) electronics.

Description of Related Technology

In transmitters, in particular in transmitters using high-order phase modulation, the availability of a discrete multi-phase clock beyond conventional IQ (90 degree phases) for clock signals is required to preserve linearity and to reduce transmission errors. Multi-phase clock generator circuits can be implemented within power amplifiers of an RF communication system. Conventional RF communication systems include, but are not limited to, mobile phones, tablets, base stations, network access points, customer premise equipment (CPE), laptops, and also wearable electronic devices. For example, in wireless devices that communicate using a cellular standard, a wireless local area network (WLAN) standard and/or any other suitable communication standard, a power amplifier can be used for RF signal amplification. Multi-phase clock generator circuits can also be used for providing clock signals to data modulators.

BRIEF DESCRIPTION OF THE DRAWINGS

Embodiments of the disclosure will now be described, by way of non-limiting example, with reference to the accompanying drawings.

DETAILED DESCRIPTION OF EMBODIMENTS

Figure 1:
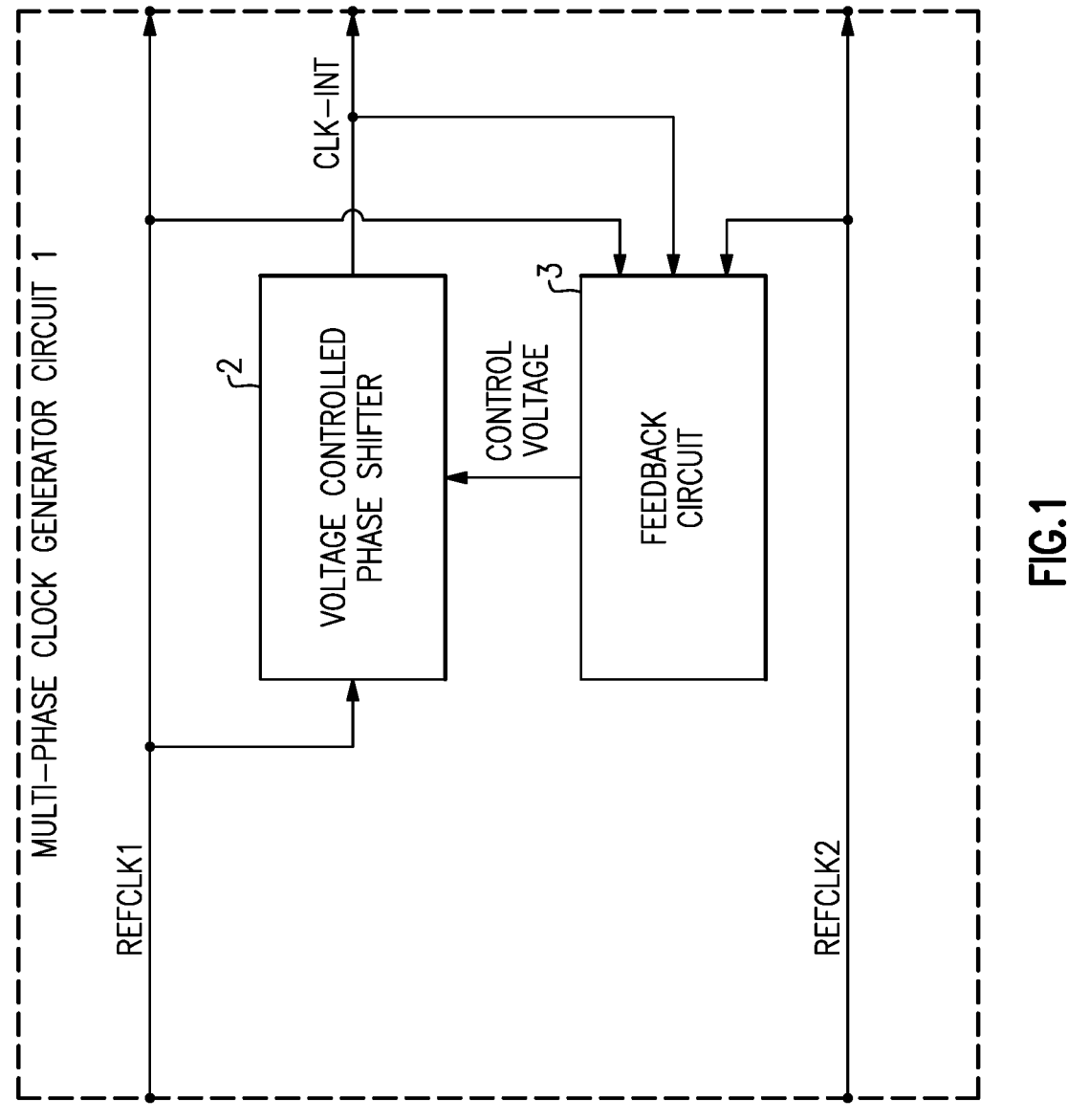
FIG. 1 is a schematic block diagram for illustrating a possible exemplary embodiment of a multi-phase clock generator circuit according to a first aspect of the present invention.

The following detailed description of certain embodiments presents various descriptions of specific embodiments. However, the innovation described herein can be embodied in a multiple of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or in a subset of the elements illustrated in a drawing. Further, some embodiments can incorporate any suitable combination or features from two or more drawings.

FIG. 1 is a block diagram for illustrating a possible exemplary embodiment of a multi-phase clock generator circuit 1 according to an aspect of the present invention. The multi-phase clock generator circuit 1 comprises in the illustrated embodiment of FIG. 1 a voltage controlled phase shifter 2. The voltage controlled phase shifter 2 is adapted to generate an interpolated clock signal CLK-INT having an interpolated phase shift with respect to at least two reference clock signals REF-CLK1 and REF-CLK2, also shown in FIG. 1. The at least two reference clock signals REF-CLK1, REF-CLK2 are received by the multi-phase clock generator circuit 1 from reference clock sources.

Figure 8:
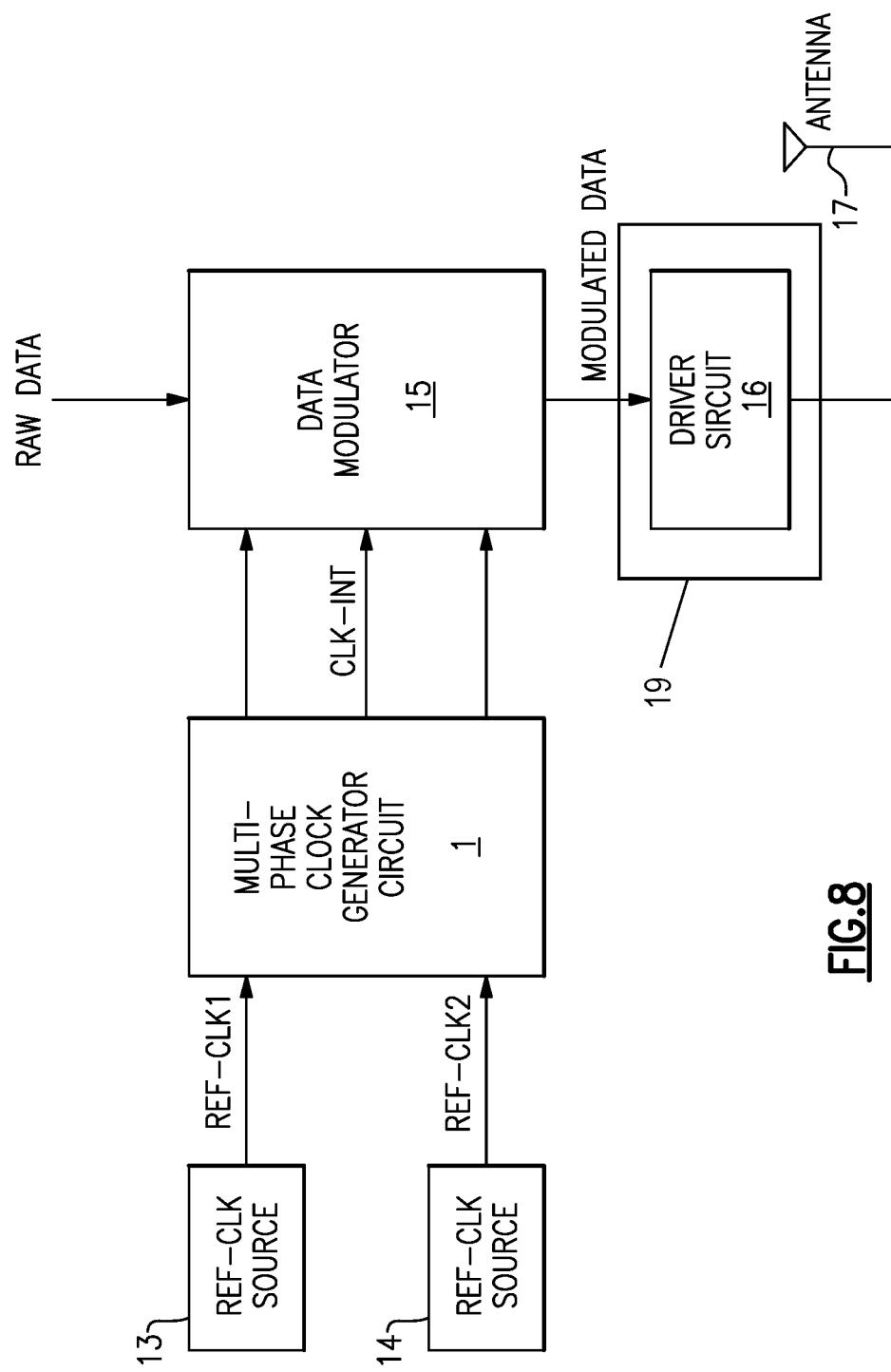
FIG. 8 is a block diagram for illustrating a possible application of a multi-phase clock generator circuit according to the present invention.

The multi-phase clock generator circuit 1 further comprises a feedback circuit 3 as shown in the block diagram of FIG. 1. The feedback circuit 3 is adapted to generate in response to a detected phase difference between the interpolated clock signal CLK-INT and the reference clock signals REF-CLK1, REF-CLK2 a control voltage applied to the voltage controlled phase shifter 2 for tuning said voltage controlled phase shifter 2. The generated interpolated clock signal CLK-INT output by the voltage controlled phase shifter 2 as well as the reference clock signals REF-CLK1, REF-CLK2 can be output by the multi-phase clock generator circuit 1 to a circuit requiring multi-phase clock signals such as a data modulator 15 as illustrated in FIG. 8. The reference clock signals REF-CLK1, REF-CLK2 received by the multi-phase clock generator circuit 1 can comprise in a possible embodiment two reference clock signals REF-CLK1, REF-CLK2 having a predefined phase difference. The predefined phase difference can be between 0 degrees and 360 degrees. In a possible implementation, the phase difference between the first reference clock signal REF-CLK1 and the second reference clock signal REF-CLK2 is 90 degrees.

Figure 2:
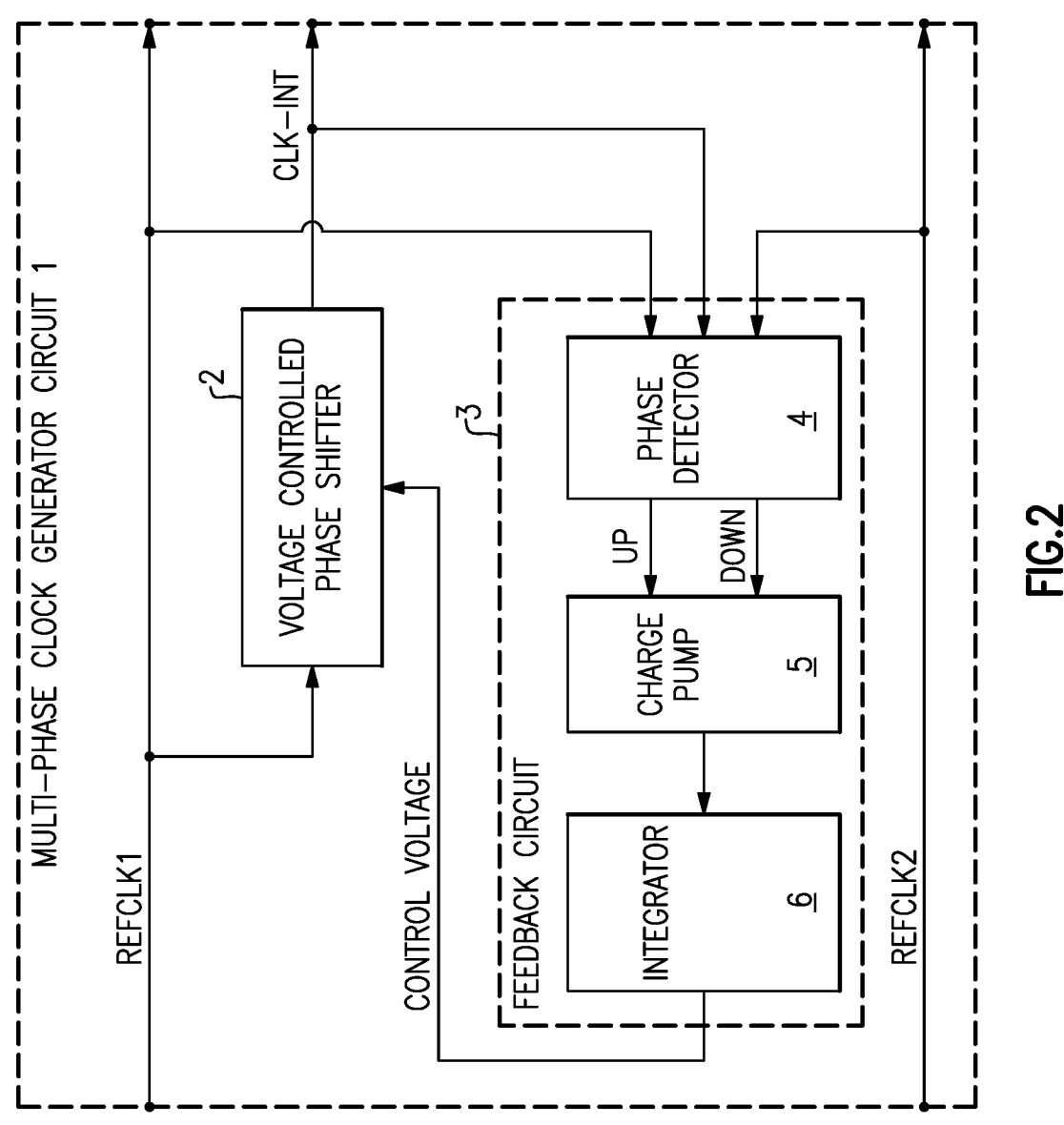
FIG. 2 is a further more detailed diagram for illustrating a possible exemplary embodiment of a multi-phase clock generator circuit according to the first aspect of the present invention.

FIG. 2 shows a possible embodiment of the multi-phase clock generator circuit 1 having a feedback circuit 3. In the illustrated embodiment of FIG. 2, the feedback circuit 3 of the multi-phase clock generator circuit 1 comprises a phase detector 4, a charge pump 5 and an integrator 6. As can be seen in FIG. 2, the phase detector 4 receives the reference clock signals REF-CLK1 and REF-CLK2 as well as the interpolated clock signal CLK-INT generated by the voltage controlled phase shifter 2. The phase detector 4 is adapted to detect a phase difference between the interpolated clock signal CLK-INT generated by the voltage controlled phase shifter 2 and reference phases of the received reference clock signals REF-CLK1, REF-CLK2. In a possible embodiment, the phase detector 4 of the feedback circuit 3 is adapted to generate duty cycle information indicating the detected phase difference between the phase of the interpolated clock signal CLK-INT and the reference phase of the received reference clock signals REF-CLK1, REF-CLK2. In a possible implementation, the duty cycle information generated by the phase detector 4 can comprise an up-signal UP and a down-signal DOWN applied to the charge pump 5 of the feedback circuit 3 as also illustrated in the block diagram of FIG. 2. In a possible implementation, the phase detector 4 can comprise logic gates adapted to generate the up-signal UP and the down-signal DOWN in response to the received reference clock signals REF-CLK1, REF-CLK2 and the interpolated clock signal CLK-INT generated by the voltage controlled phase shifter 2.

The charge pump 5 of the feedback circuit 3 is adapted to receive the duty cycle information provided by the phase detector 4 of the feedback circuit 3. The charge pump 5 is adapted to convert the received duty cycle information into current pulses supplied to the integrator 6 of the feedback circuit 3. The integrator 6 is adapted to generate the control voltage applied to the voltage controlled phase shifter 2 depending on the received current pulses. The phase detector 4 and the charge pump 5 may operate at a carrier frequency to convert the phase difference into the control voltage by means of the integrator 6. The generated voltage does feed back into the voltage controlled phase shifter 2 for a closed loop system operation. In the illustrated embodiment, the carrier frequency is the high signal frequency of the reference clock signals REF-CLK1, REF-CLK2. The reference clock signals REF-CLK1, REF-CLK2 can comprise a high frequency up to 6 GHz or even up to 20 GHz.

The voltage controlled phase shifter 2 can comprise in a possible implementation an active delay line. In an alternative embodiment, the voltage controlled phase shifter 2 can also comprise a passive delay filter.

In a possible embodiment, an active low bandwidth amplifier of the integrator 6 and at least one parallel switched resistor network of the charge pump 5 are adapted to compensate mismatch and temperature drift. The multi-phase clock generator circuit 1 operates in closed feedback loop. The circuit 1 is adapted to autocorrect itself and can calibrate in the background against temperature drift as well as process and device mismatches. The multi-phase clock generator circuit 1 generates little power overhead and little added noise.

The voltage controlled phase shifter 2 of the multi-phase clock generator circuit 1 is adapted to generate an interpolated clock signal CLK-INT within an adjustable interpolated phase shift which can be output by the multi-phase clock generator circuit 1 to an external circuitry which may vary depending on the use case. The reference clock signals REF-CLK1, REF-CLK2 received by the multi-phase clock generator circuit 1 can comprise in the illustrated embodiment of FIGS. 1, 2 two reference clock signals REF-CLK1, REF-CLK2 having a predefined phase difference of e.g. 90 degrees. In other implementations, the number of received reference clock signals may vary.

Figure 3:
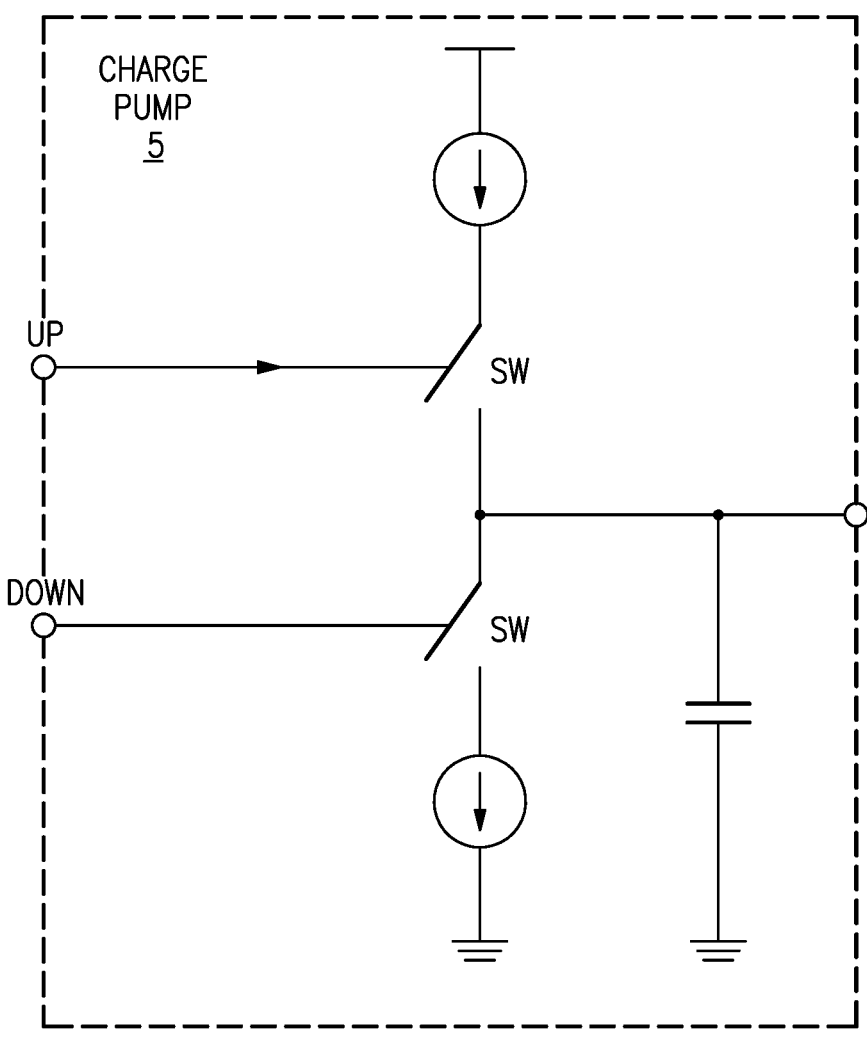
FIG. 3 is a circuit diagram for illustrating a possible exemplary implementation of a charge pump within a feedback circuit of the multi-phase clock generator circuit as illustrated in FIGS. 1 and 2.

FIG. 3 shows a circuit diagram for illustrating schematically a possible implementation of a charge pump 5 within the feedback circuit 3 as illustrated in FIG. 2. In the illustrated implementation, the charge pump 5 may comprises controllable switches SW to switch internal current sources to its output terminal. The charge pump 5 can output positive and negative current pulses to its output depending on the received duty cycle information which may comprise an up-signal UP and a down-signal DOWN as illustrated in FIG. 3. The up- and down-signal control the internal switches SW of the charge pump 5 to provide positive or negative current pulses applied via the output terminal of the charge pump 5 to the integrator 6.

Figure 4:
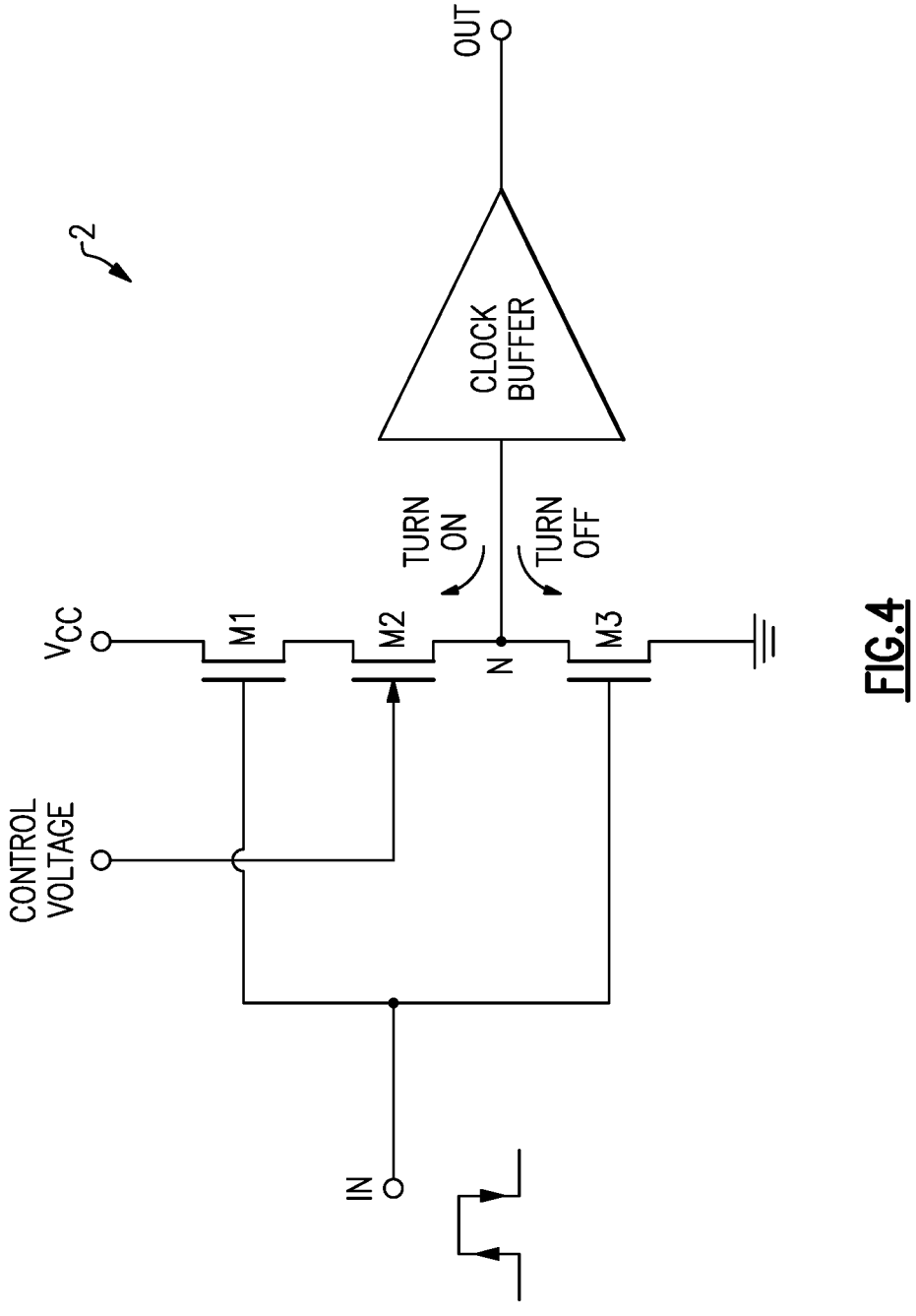
FIG. 4 is a circuit diagram for illustrating a possible exemplary implementation of a voltage controlled phase shifter within a multi-phase clock generator circuit according to the first aspect of the present invention.

FIG. 4 shows a circuit diagram for illustrating a possible exemplary embodiment of a voltage controlled phase shifter 2 within the multi-phase clock generator circuit 1. In the illustrated implementation, the voltage controlled phase shifter 2 receives an analog control voltage from the integrator 6. The received control voltage is applied to the gate terminal of MOSFET M2 to adjust its resistance R. The MOSFET M2 is connected in series with MOSFET M1 and MOSFET M3 as shown in the circuit diagram of FIG. 4. At the positive signal flank of a received clock signal, the potential of node N is pulled up to the positive supply voltage Vcc. During turn-off, the potential at node N is pulled to ground as illustrated in FIG. 4. Node N is connected via a clock buffer to the output terminal of the voltage controlled phase shifter 2. The received control voltage controls the resistance R of MOSFET M2 which in turn controls the phase shift of the received reference clock signal.

Figure 5:
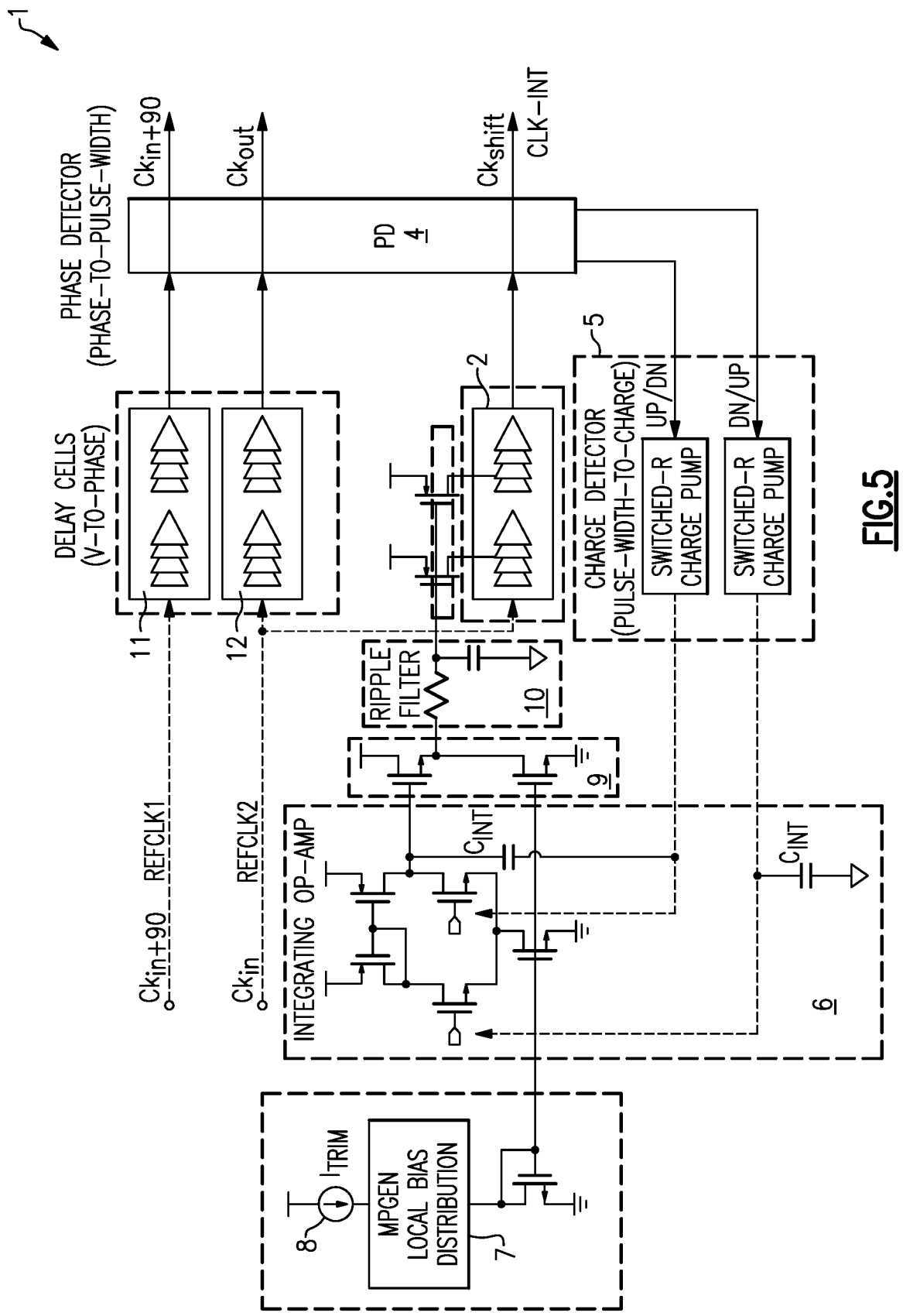
FIG. 5 shows a further circuit diagram for illustrating a possible exemplary embodiment of a multi-phase clock generator circuit according to the first aspect of the present invention.

FIG. 5 shows a circuit diagram for illustrating a possible exemplary embodiment of a multi-phase clock generator circuit 1 according to the first aspect of the present invention.

In the illustrated embodiment, the integrator 6 of the feedback circuit 3 is implemented by an integrating operation amplifier. The integrating operation amplifier comprises a low bandwidth operation amplifier having integration capacitors Cint to convert the charge or current pulses received from the charge pump 5 into a voltage. The integrator 6 is connected via a mirror circuit to a local bias distribution circuit 7. The local bias distribution circuit 7 receives a reference current $I_{TRIM}$ from a reference current source 8 as illustrated in FIG. 5. The reference current is copied by means of the mirror circuit to the integrating operation amplifier of the integrator 6. The integrator 6 generates a voltage from the current pulses received from the charge pump 5 and applies the generated voltage to a level shifting buffer circuit 9 as shown in FIG. 5. The level shifting buffer circuit 9 is adapted to shift the received control voltage to a lower potential which may be suitable for the voltage controlled delay line 2. The level shifting buffer circuit 9 further isolates the voltage controlled delay line signals from leaking backward into the integrating operation amplifier of the integrator 6. The output of the level shifting buffer circuit 9 is connected in the illustrated implementation of FIG. 5 to a ripple filter 10. The ripple filter 10 is adapted to reduce the ripple of the control voltage which can be induced by the charge pump activity and does also reverse leakage from the voltage controlled delay line toggling. The ripple filter 10 provides the control voltage signal for controlling the active delay filter 2 illustrated in FIG. 5. In the illustrated embodiment, the voltage controlled phase shifter 2 can comprise an active tunable delay filter used to phase shift the received reference clock signal REF-CLK2 depending on the received control voltage output by the ripple filter 10. In the illustrated embodiment of FIG. 5, the multi-phase clock generator circuit 1 comprises replica delay filters 11, 12 having delay cells. The replica delay filters 11, 12 are provided for matching to the active tuning delay filter 2 to compensate excess non-tunable delays which may exist in the active tuning delay filter 2.

Figure 6:
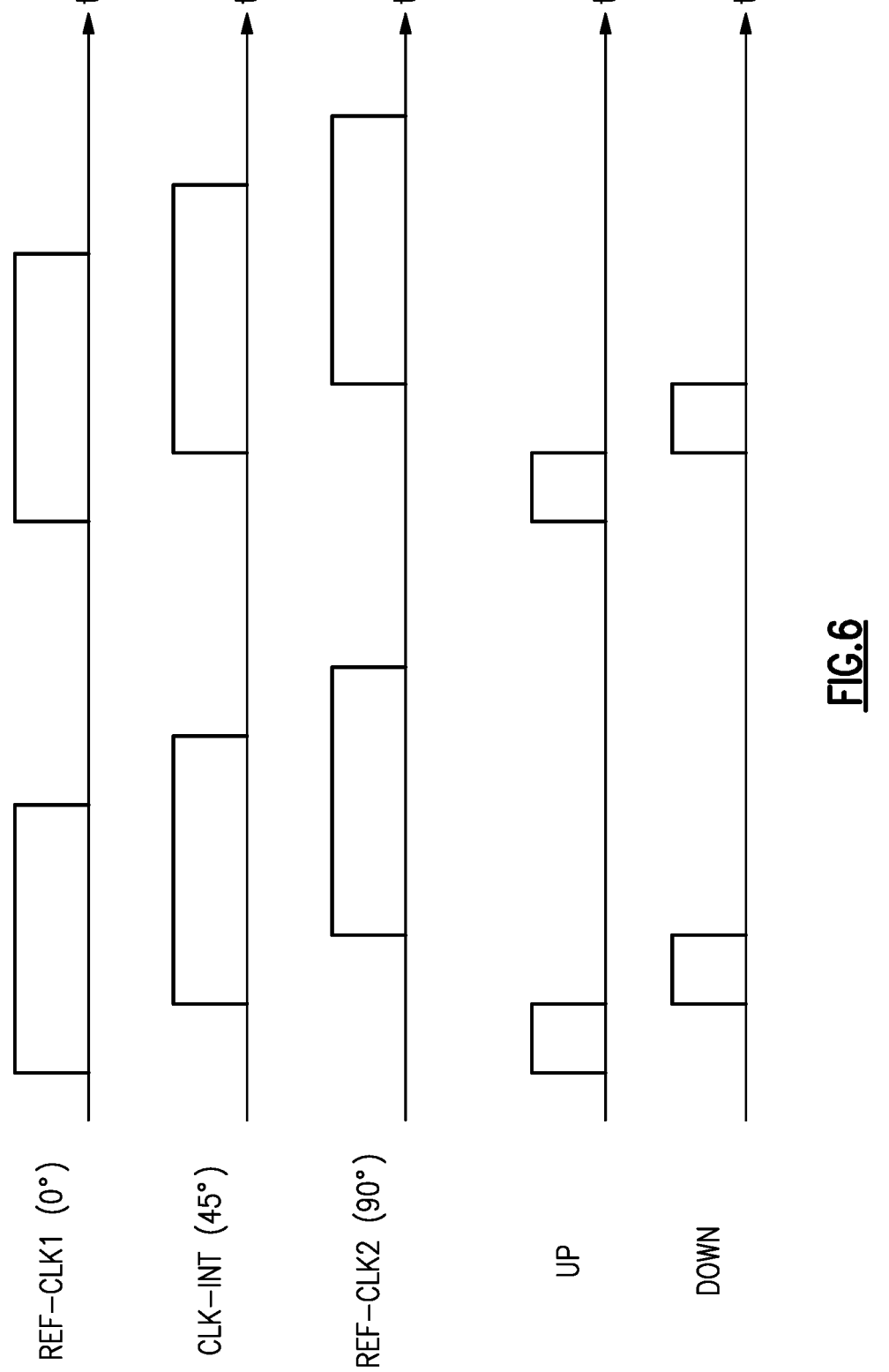
FIG. 6 are signal diagrams for illustrating the operation of a multi-phase clock generator circuit according to the present invention.

FIG. 6 shows signal diagrams for illustrating the operation of a multi-phase clock generator circuit 1 according to the first aspect of the present invention. In the illustrated example, the first reference clock signal REF-CLK1 and the second reference clock signal REF-CLK2 received by the multi-phase clock generator circuit 1 from reference clock sources comprise a predefined phase difference of 90 degrees. Logic gates within the phase detector 4 can generate the up-signal UP and the down-signal DOWN as also illustrated in the signal diagram of FIG. 6 in response to the received reference clock signals REF-CLK1, REF-CLK2 and the interpolated clock signal CLK-INT generated by the voltage controlled phase shifter 2. The up- and down-signal comprise duty cycle information extracted from the interpolated clock signal CLK-INT applied to the charge pump 5. The duty cycle information indicates the detected phase difference between the phase of the interpolated clock signal CLK-INT and the reference phases of the received reference clock signals REF-CLK1, REF-CLK2. In the illustrated example of FIG. 6, a phase of the interpolated clock signal CLK-INT is 45 degrees. The interpolated phase is generated internally and compared against the two reference phases of the reference clock signals REF-CLK1, REF-CLK2. Duty cycle information is generated as illustrated in FIG. 6 and converted in the feedback loop into a control voltage. The voltage information is passed back into the tunable phase filter (delay line), i.e. the voltage controlled phase shifter 2. In the illustrated example of FIG. 6, the phase shift comprises 45 degrees. Other phase shifts are also possible. For instance, a 60 degree phase shift can be achieved as well. The duty cycle information corresponds to the ratio of the length of the up- and down-pulses illustrated in FIG. 6. The ratio of 1:1 as illustrated in FIG. 6 corresponds to a phase shift of 45 degrees.

Figure 7:
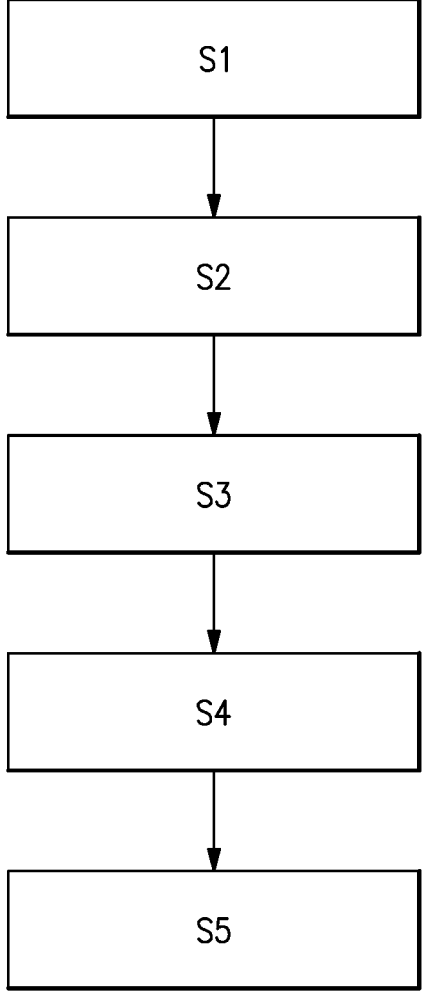
FIG. 7 is a flowchart for illustrating a possible exemplary embodiment of a method for generating block signals with adjustable phase shifts according to a further aspect of the present invention.

FIG. 7 shows a flowchart to illustrate a possible exemplary embodiment of a method for generating clock signals with adjustable phase shifts according to a further aspect of the present invention. In the illustrated exemplary embodiment, the method comprises five main steps.

In a first step S1, reference clock signals REF-CLK1, REF-CLK2 are received from reference clock sources.

In a further step S2, an interpolated clock signal CLK-INT is generated by means of a voltage controlled phase shifter 2. The interpolated clock signal CLK-INT has an interpolated phase shift with respect to the received reference clock signals REF-CLK1, REF-CLK2.

In a further step S3, a phase difference between the generated interpolated clock signal CLK-INT and the received reference clock signals is detected.

In step S4, the control voltage is generated in response to the detected phase difference applied to the voltage controlled phase shifter 2 for tuning said voltage control phase shifter 2.

Finally in step S5, the generated interpolated clock signal CLK-INT is output with the interpolated phase shift for further processing.

In a possible embodiment, the reference clock signals REF-CLK1, REF-CLK2 received in step S1 can comprise two reference clock signals REF-CLK1, REF-CLK2 with a predefined phase difference. This predefined phase difference can be in a range between 0 degrees and 360 degrees. In a preferred embodiment, the predefined phase difference of the received clock signals comprises 90 degrees as also illustrated in the signal diagram of FIG. 6.

FIG. 8 shows a possible application of the multi-phase clock generator circuit 1 according to the first aspect of the present invention. In the illustrated exemplary circuitry, the multi-phase clock generator circuit 1 receives a first reference clock signal REF-CLK1 from a first reference clock source 13 and a second reference clock signal REF-CLK2 from a second reference clock source 14. The multi-phase clock generator circuit 1 is adapted to generate the interpolated clock signal CLK-INT which is supplied in the illustrated exemplary circuitry to a data modulator 15. The data modulator 15 is adapted to modulate a received raw data signal stream (e.g., digital I/Q data) using the interpolated clock signal CLK-INT generated by the multi-phase clock generator circuit 1 to generate modulated data as illustrated in FIG. 8. The modulated data can be supplied to a front end 19 that can include a driver circuit 16 which is connected to a transmission antenna 17. For example, the front end 19 can be any of the radio frequency front ends described herein, such as the front end 840 of FIG. 8A or the front end 103 of FIG. 9. The driver circuit 16 can be a transmit signal power amplifier, for example. While FIG. 8 illustrates a transmit path implementation, in some embodiments, the multi-phase clock generator circuit 1 can alternatively or additionally be used in a receive path, wherein the multi-phase clock generator circuit 1 can provide clock signals to a demodulator circuit. For example, in such an implementation, a radio frequency wireless device can include a demodulator circuit that receives the clock signals and demodulates RF downlink data that is detected by an antenna and amplified by a low noise amplifier.

Figure 8A:
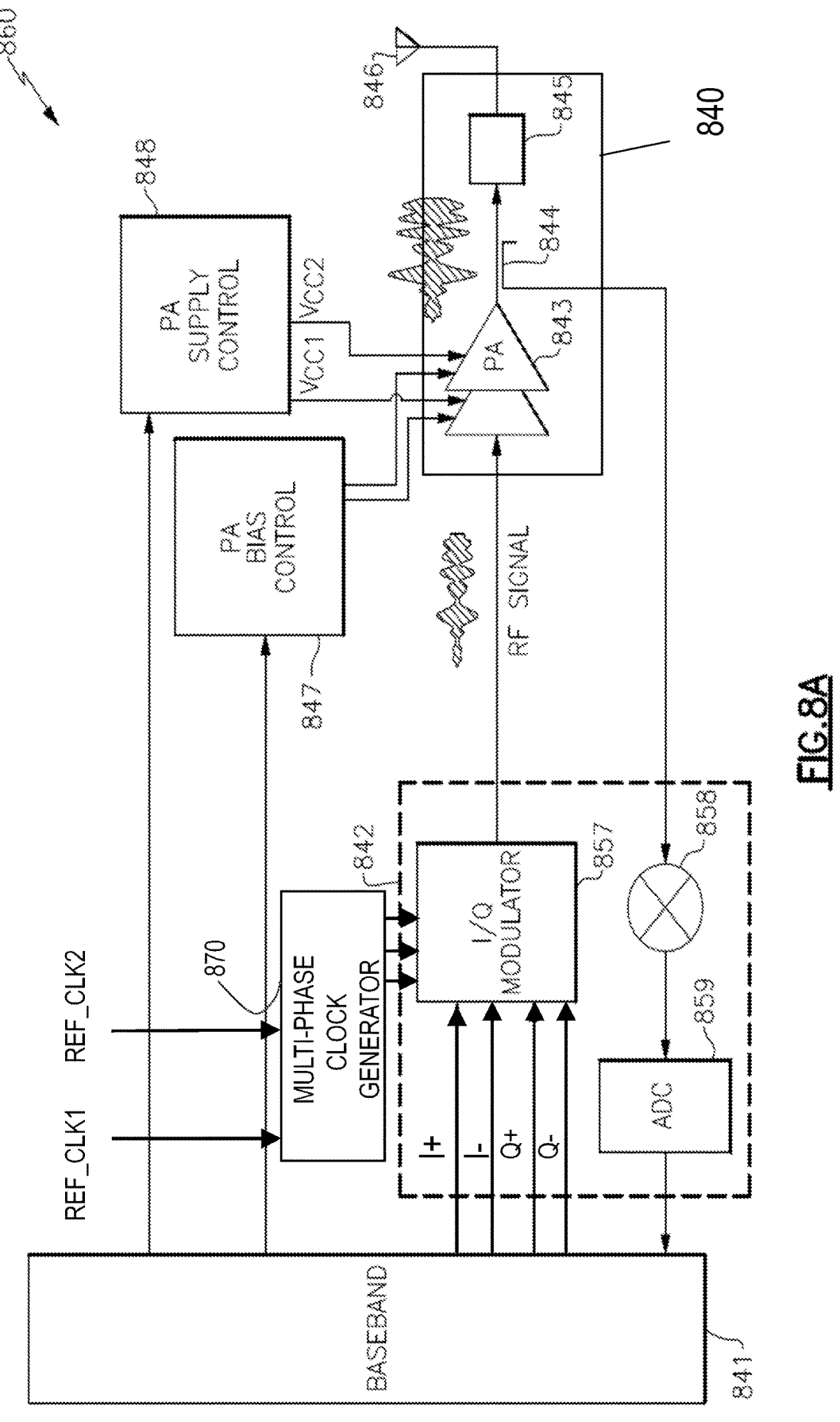
FIG. 8A is a schematic diagram of a power amplifier system according to one embodiment.

FIG. 8A is a schematic diagram of a power amplifier system 860 according to one embodiment. The illustrated power amplifier system 860 includes a baseband processor 841, a transmitter/observation receiver 842, a power amplifier (PA) 843, a directional coupler 844, a radio frequency front end 840 including front-end circuitry 845 and the power amplifier 843, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver. The power amplifier system 860 of FIG. 8A also includes a multi-phase clock generator 870, which can be any of the multi-phase clock generator circuits described herein. For example, the multi-phase clock generator 870, I/Q modulator 857, front end 840, power amplifier 843, and antenna 846 can be the same as the multi-phase clock generator circuit 1, data modulator 15, front end 19, driver circuit 16, and antenna 17 of FIG. 8, respectively.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format.

The baseband processor 841 can implement higher order phase-modulation. For instance, the baseband processor 841 can implement four phase I/Q modulation and output I+/I− and Q+/Q− signals. The multi-phase clock generator 870 can help preserve transmit linearity and reduce transmission errors when used in conjunction with the transmitter having a higher order phase-modulation, such as the four phase I/Q modulation of the illustrated embodiment. The multi-phase clock generator 870 can output at least three click signals, which can include 0°, 45°, and 90° clock signals such as those generated by the multi-phase clock generator circuit 1 described herein, e.g., with respect to FIGS. 1, 2, 6 and 8. In some cases, more than three clock signals can be output, e.g., including four or more of 0°, 45°, 90°, 135°, 180°, 225°, 270°, and 315° clock signals.

The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier can be switched capacitor power amplifier in certain embodiments.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 8A, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 9:
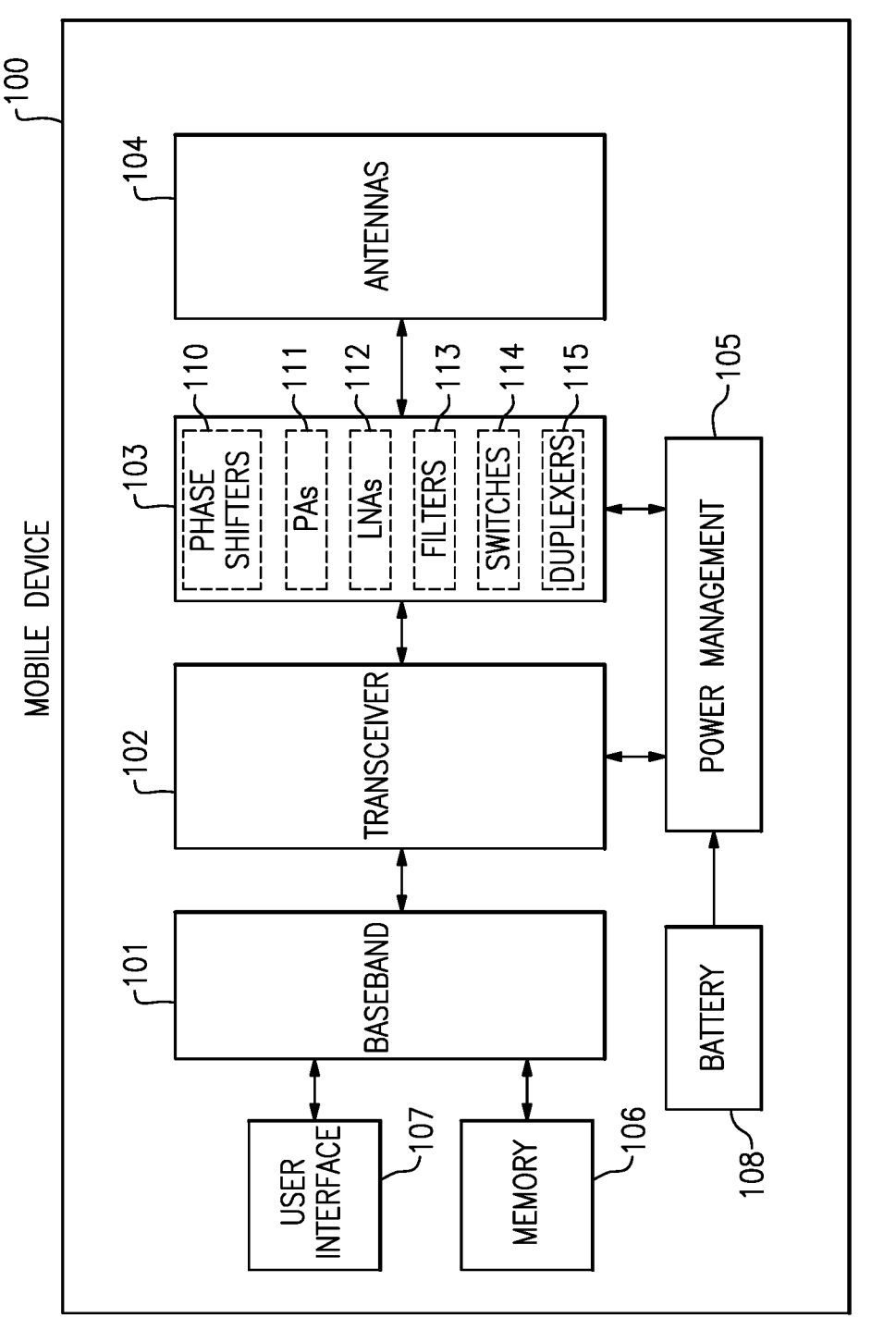
FIG. 9 shows a block diagram for illustrating a possible embodiment of a mobile device having a frontend which can comprise multi-phase clock generator circuits according to the first aspect of the present invention.

FIG. 9 illustrates a schematic diagram of a possible embodiment of a mobile device 100. The mobile device 100 includes a baseband system 101, a transceiver 102, a frontend system 103, antennas 104, a power management system 105, a memory 106, a user interface 107 and a battery 108. The mobile device 100 can be used to communicate using a wide variety of communication technologies including, but not limited to, 2G, 3G, 4G (including LTE, LTE-Advanced and LTE-Advanced Pro), 5G NR, WLAN (for instance Wi-Fi), WPAN (for instance Bluetooth and ZigBee), WMAN (for instance WiMAX) and/or GPS technologies.

The transceiver 102 is adapted to generate RF signals for transmission and may also process incoming RF signals received from the antenna 104. The frontend system 103 is adapted to condition signals transmitted and/or received from the antennas 104. In the illustrated implementation, the frontend system 103 may comprise phase shifters 110, power amplifiers 111, low noise amplifiers 112, filters 113, switches 114 and duplexers 115. Other implementations of the frontend system 103 are possible. The multi-phase clock generator circuit 1 according to the first aspect of the present invention can be used to generate interpolated clock signals CLK-INT for different entities within the frontend system 103.

The multi-phase clock generator circuit 1 can also be provided to generate modulated clock signals for the periphery within the baseband system 101 or within the transceiver 102.

The above detailed description of embodiments of the invention is not intended to be exhaustive or to limit the invention to the precise form disclosed above. While specific embodiments of and examples for the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined and/or modified. Each of these processes or blocks may be implemented in a variety of different ways. Also, while processes or blocks are at times shown as being performed in series, these processes or blocks may instead be performed in parallel, or may be performed at different times.

The teaching of the present invention provided herein can be applied to other systems, not necessarily the system described above. The elements and acts of the various embodiments described above can be combined to provide further embodiments.

While certain embodiments of the invention have been described, these embodiments have been presented by way of example only, and are not intended to limit the scope of the disclosure. Indeed, the novel method and systems described herein may be embodied in a variety of other forms. Furthermore, various omissions, substitutions and changes in the form of the method and systems described herein may be made without departing from the spirit of the disclosure. The accompanying claims and the equivalents are intended to cover such forms or modifications as would fall within the scope and spirit of the disclosure.

The invention claimed is:

1. A multi-phase clock generator circuit comprising:
a voltage controlled phase shifter adapted to generate an interpolated clock signal having an interpolated phase shift with respect to at least two reference clock signals received by the multi-phase clock generator circuit from reference clock sources; and
a feedback circuit adapted to generate in response to a detected phase difference between the interpolated clock signal and the reference clock signals a control voltage applied to the voltage controlled phase shifter for tuning the voltage controlled phase shifter.

2. The multi-phase clock generator circuit according to claim 1 wherein the feedback circuit includes a phase detector adapted to detect a phase difference between the interpolated clock signal generated by the voltage controlled phase shifter and reference phases of the received reference clock signals.

3. The multi-phase clock generator circuit according to claim 2 wherein the phase detector of the feedback circuit is adapted to generate duty cycle information indicating the detected phase difference between the phase of the interpolated clock signal and the reference phase of the received reference clock signals.

4. The multi-phase clock generator circuit according to claim 3 wherein the duty cycle information generated by the phase detector includes an up-signal and a down-signal applied to internal switches of the charge pump.

5. The multi-phase clock generator circuit according to claim 4 wherein the phase detector includes logic gates adapted to generate the up-signal and the down-signal in response to the received reference clock signals and the interpolated clock signal generated by the voltage controlled phase shifter.

6. The multi-phase clock generator circuit according to claim 3 wherein the feedback circuit includes a charge pump adapted to receive the duty cycle information generated by the phase detector of the feedback circuit and to convert the duty cycle information into current pulses supplied to an integrator of the feedback circuit adapted to generate the control voltage applied to the voltage controlled phase shifter.

7. The multi-phase clock generator circuit according to claim 1 wherein the voltage controlled phase shifter includes an active delay line.

8. The multi-phase clock generator circuit according to claim 1 wherein the voltage controlled phase shifter includes a passive delay filter.

9. The multi-phase clock generator circuit according to claim 6 wherein an active low bandwidth amplifier of the integrator and at least one parallel switched resistor network of the charge pump are adapted to compensate mismatch and temperature drift.

10. The multi-phase clock generator circuit according to claim 1 wherein the voltage controlled phase shifter is adapted to generate an interpolated clock signal with an adjustable interpolated phase shift output by said multi-phase clock generator circuit.

11. The multi-phase clock generator circuit according to claim 1 wherein the reference clock signals received by the multi-phase clock generator circuit include two reference clock signals with a predefined phase difference.

12. The multi-phase clock generator circuit according to claim 11 wherein the reference clock signals include a predefined phase difference between 0 degrees and 360 degrees.

13. The multi-phase clock generator circuit according to claim 6 wherein the control voltage generated by the integrator of the feedback circuit is supplied via a level shifting buffer to a ripple filter adapted to reduce ripples in the control voltage.

14. The multi-phase clock generator circuit according to claim 2 wherein the reference clock signals are supplied via replica delay filters to the phase detector of the feedback circuit.

15. The multi-phase clock generator circuit according to claim 1 wherein the generated interpolated clock signal generated by the voltage controlled phase shifter is applied to a data modulator.

16. A radio frequency transmitter comprising:
a multi-phase clock generator circuit, the multi-phase clock generator circuit including a voltage controlled phase shifter adapted to generate an interpolated clock signal having an interpolated phase shift with respect to at least two received reference clock signals, and the multi-phase clock generator circuit further including a feedback circuit adapted to generate, in response to a detected phase difference between the interpolated clock signal and the reference clock signals, a control voltage applied to the voltage controlled phase shifter for tuning the voltage controlled phase shifter;
an I/Q data modulator that receives I/Q input signals, the at least two reference clock signals, and the interpolated clock signal, and configured to output a modulated signal; and
a power amplifier configured to receive the modulated signal output by the I/Q data modulator.

17. The transmitter according to claim 16 further comprising reference clock signal sources adapted to generate the reference clock signals supplied to the multi-phase clock generator circuit.

18. A method for generating clock signals with adjustable phase shift, the method comprising the steps of:

receiving reference clock signals from reference clock
   sources;
generating by a voltage controlled phase shifter an inter-
   polated clock signal having an interpolated phase shift
   with respect to the received reference clock signals;
detecting a phase difference between the generated inter-
   polated clock signal and the received reference clock
   signals;
generating a control voltage in response to the detected
   phase difference applied to the voltage controlled phase
   shifter for tuning the voltage controlled phase shifter;
   and
outputting the generated interpolated clock signal with the
   interpolated phase shift.

19. The method according to claim 18 wherein the refer-
ence clock signals include two reference clock signals with
a predefined phase difference.

20. The method according to claim 18 wherein the refer-
ence clock signals include a predefined phase difference in
a range between 0 degrees and 360 degrees.

21. The method according to claim 20 wherein the refer-
ence clock signals include a predefined phase difference of
90 degrees.

*     *     *     *     *